United States Patent [19]

Gleason et al.

[11] 3,878,008

[45] Apr. 15, 1975

[54] METHOD OF FORMING HIGH RELIABILITY MESA DIODE

[75] Inventors: K. Reed Gleason, Washington, D.C.; Marvin L. Bark, Baltimore, Md.

[73] Assignee: The United States of America as represented by the Secretary of the Navy, Washington, D.C.

[22] Filed: Feb. 25, 1974

[21] Appl. No.: 445,375

[52] U.S. Cl. .................... 156/11; 117/212; 156/13; 156/17; 357/56

[51] Int. Cl. .................... H01l 7/50

[58] Field of Search .................... 156/3, 11, 13, 16, 17; 117/212; 96/36.2; 29/580, 583, 589–591; 317/235 AK; 357/56

[56] References Cited

UNITED STATES PATENTS

| | | | |
|---|---|---|---|
| 3,675,314 | 7/1972 | Levi | 29/580 X |
| 3,689,993 | 9/1972 | Tolar | 29/583 |
| 3,709,695 | 1/1973 | Bowman | 96/36.2 |
| 3,728,236 | 4/1973 | Weller et al. | 204/129.1 |
| 3,816,194 | 6/1974 | Kroger et al. | 156/3 |

*Primary Examiner*—William A. Powell
*Attorney, Agent, or Firm*—R. S. Sciascia; Arthur L. Branning; G. A. Montanye

[57] ABSTRACT

An improved semiconductor device and technique for fabricating diced mesas in a semiconductor wafer. Two metal layers are coated over the active surface of a semiconductor wafer and etched using standard photoresist techniques to define specific metal dot areas. The wafer is subsequently etched to facilitate dicing of the wafer and reduce wafer thickness. Using the metal dots as masks and differential etches, the contact metal is etched to recede beyond the mesa edge to form the top contact on a semiconductor device having low parasitic capacitance and high resistance to edge breaking and metal shorting of the semiconductor junction.

8 Claims, 11 Drawing Figures

METHOD OF FORMING HIGH RELIABILITY MESA DIODE

BACKGROUND OF THE INVENTION

The present invention relates to improvements in mesa semiconductor devices and in the techniques for forming a semiconductor device and more particularly to new and improved techniques for forming a mesa semiconductor diode.

In the field of semiconductor device manufacturing it has been general practice to employ mesa etching techniques for the formation of diodes, particularly TRAPATT (Trapped Plasma Avalanche Transit Time) diodes. Particular problems have been encountered with those techniques especially where the wafer is to be diced and flip-chip bonded in an electronic circuit.

In a known method for mesa fabrication a metallized dot is defined on the active surface of a semiconductor wafer and used as a mask to etch the mesa in the semiconductor material. In addition to problems in depositing the dot, the etch used to attack the semiconductor wafer tends to undercut the metal area defining the dot during formation of the mesa. This leads to particular problems when the mesa is constructed as a TRAPATT diode where high current densities frequently cause filaments of the overhanging metal to migrate down the side of the mesa shorting the diode junction. In other cases, the overhanging metal often droops over the side of the mesa causing a physical shorting of the junction. In processes where thermocompression bonding techniques are employed to bond the diode in circuit, pressure at the mesa edge often causes breaking of the edge and destruction of the diode. While etching after bonding can correct the problems to some degree, the danger of contamination of the semiconductor is greater at this time, and control of mesa dimensions is diminished.

Other known techniques for mesa fabrication have used mechanical scribing to separate the mesas as well as mechanical devices to eliminate the metal overhang. Such methods suffer from the introduction of mechanical stresses during separation which can ultimately lead to diode failure.

Accordingly, the present invention has been developed to overcome the specific shortcomings of the above known and similar techniques and to provide a technique for forming a more precise and reliable mesa structure.

SUMMARY OF THE INVENTION

The general purpose of this invention is to provide an improved mesa semiconductor and a mesa etching and dicing technique that has all the advantages of similarly employed techniques and none of the disadvantages. The invention is designed to provide a precisely constructed mesa structure that is highly reliable, easily handled, and has a long life during use in electronic circuits.

Accordingly, it is an object of the present invention to provide an improved technique for forming a mesa in a semiconductor wafer.

Another object of the invention is to provide an improved mesa semiconductor having plural metal contact areas.

A further object of the invention is to provide a technique for dicing and thinning a semiconductor wafer to form a plurality of low capacitance mesa chips.

Still another object of the invention is to provide a technique for preventing metal overhang at the semiconductor junction.

A still further object is to provide for the precise positioning of the metal dot edge relative to the mesa edge to define a mesa diode, including, for example, a TRAPATT diode.

Yet another object of the invention is to prevent chemical contamination of the semiconductor junction during formation of the device.

In order to accomplish the above and other objects, the invention provides for the formation of a semiconductor wafer having an active surface layer coated with two distinct metal layers. Using known photoresist techniques, a plurality of metal dot areas are etched in the wafer each composed of first and second concentric metal dots and a metal contact button. In addition, the semiconductor wafer is etched along lines which form the lines of separation between the mesa structures or chips. The reverse side of the wafer is then metallized and a support attached to support the wafer during further processing. Subsequently, the metal dots are used as masks to further etch and reduce the wafer thickness. Using the first metal dot as a mask the second dot is etched and the wafer again etched to further reduce wafer thickness. In order to eliminate metal dot overhang at the mesa edge, due to wafer undercutting, the second metal dot is etched to recede beyond the mesa edge using the first metal dot to prevent complete removal of the second metal dot. The final contact area is then formed by etching the first metal dot. This technique results in a highly reliable diode having low parasitic capacitance and high resistance to metal edge shorting and breaking.

Other objects, advantages, and novel features of the invention will become apparent from the following detailed description of the invention when considered with the accompanying drawings wherein:

DETAILED DESCRIPTION

Figure 1:
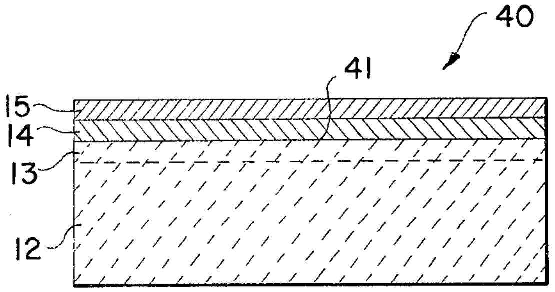
FIGS. 1–10 illustrate the sequential steps in the formation of a mesa diode according to the present invention.

Referring to FIG. 1, a metallized semiconductor wafer is generally shown at 40 and composed of a semiconductor wafer having a substrate 12 and an active surface region schematically shown at 13 and metal layers 14 and 15 coated over the entire active surface 41 of the wafer. The semiconductor wafer can be formed of most materials (silicon, germanium, gallium arsenide, for example) and can have any epitaxial and diffusion structure (region 13) appropriate to the device being constructed. In the present example an $n^+$ silicon substrate with a p type epitaxial layer and a $p^+$ diffusion formed the structure for a TRAPATT diode. The metal layers 14 and 15 were chromium and gold respectively deposited by evaporation or sputtering techniques for metallization as is well known in the art. The chromium is used in this example to prevent gold alloying at the surface of the silicon from destroying the diode junction. Typically the metal layers are each about 0.1 micron in thickness and the substrate greater than 100 microns, although for purposes of illustration the relative thicknesses have been exaggerated in the drawings.

Figure 2:
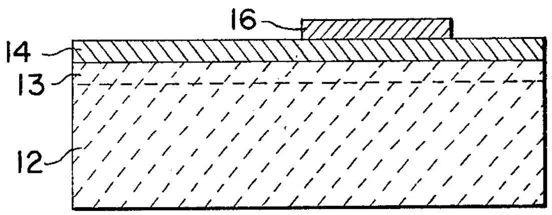

Starting with the metallized wafer 40 of FIG. 1, a first metal dot 16, as shown in FIG. 2, is etched using standard photoresist techniques. The photoresist is first coated on the surface of the gold layer 15 and developed to leave a pattern of exposed photoresist (not shown) having the shape of the desired dot 16. The wafer is then immersed in an etch which attacks the gold layer not protected by exposed photoresist and which does not react with the silicon or chromium (for example, a saturated solution of potassium iodide and iodine (about 10 g/100 cc water) in water, all at room temperature). About 20 seconds is sufficient to etch the gold layer 15 to form the gold dot 16 (about 6 mils in diameter for example). While reference is being made to only one particular dot, it is evident that the photoresist can be patterned to provide a plurality of dot areas over the surface of the metallized wafer 40 as is desired in forming flip-chip devices (see FIG. 11).

Figure 3:
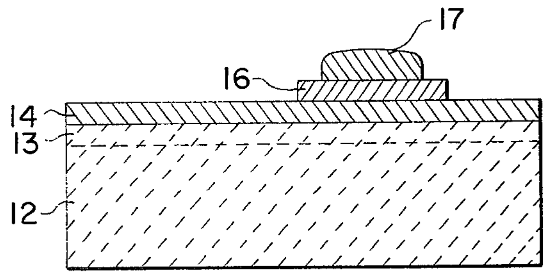

After stripping the exposed photoresist from dot 16, the wafer is again coated with a photoresist and exposed so as to leave a hole concentric with dot 16. A gold button 17 (to be used as a contact and about 5 mils in diameter) is then deposited on the gold dot 16 by electroplating to form the structure as shown in FIG. 3. As the gold button 17 is normally 10–100 times the thickness of the gold layer 15, it can be seen that by first defining the gold dot and then electroplating the button, interference of the button during photoresist definition of the dot 16 is eliminated. It should further be noted that electroplating must be performed no later than this step since the continuous chrome layer 14 is needed for the electroplating process.

Figure 4:
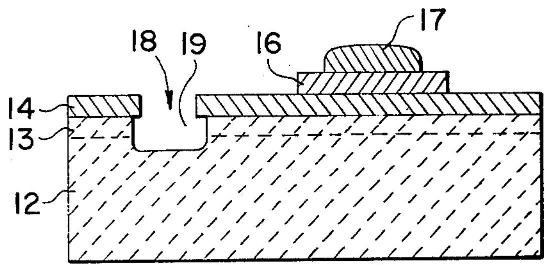
Figure 11:
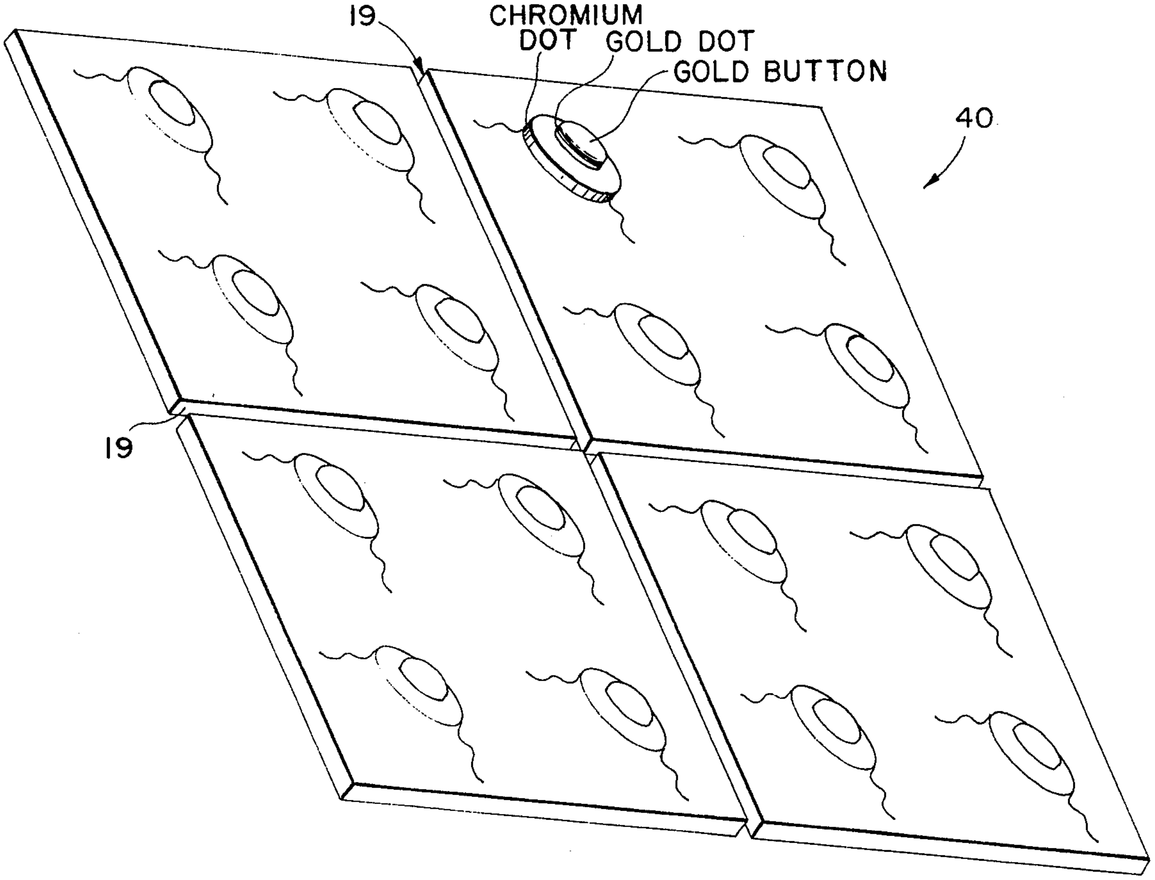
FIG. 11 shows a perspective view of a completed wafer section prior to separation into chips.

Again the exposed photoresist is stripped and a further photoresist coating deposited and developed so as to define a series of grid lines along which the wafer will be separated. The grid lines are formed by first etching the chromium to open the lines 18 (about 1 mil wide) as shown in FIG. 4, and then etching the silicon to etch the substrate along the same pattern at 19 to a depth of about 50 microns. The resultant grid pattern is best shown by lines 19 in FIG. 11 showing the wafer prior to separation. The etch used for chromium was a commercially prepared 50% permanganate ($KMnO_4$) solution mixed on a 1-1 basis (by volume) with a 20% hydroxide (KOH) solution, all at 40°–45°C. The silicon etch was a combination of nitric acid (82 cc), acetic acid (27 cc) and HF (16 cc) all at room temperature, with the moisture content minimized.

Figure 5:
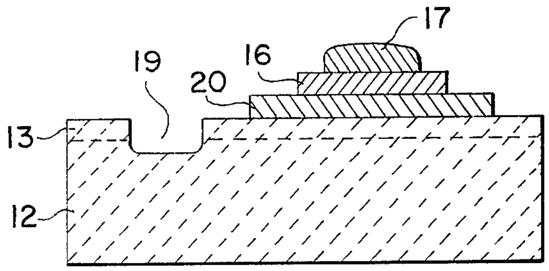

Again the exposed photoresist is stripped, the wafer recoated with photoresist and developed, and the layer 14 etched to form a chromium dot 20 (10 mils in diameter), for example) concentric with metal dot 16, as is shown by FIG. 5.

At this point all steps involving the application of photoresist have been completed even though several etching steps remain. In prior known techniques where the substrate was etched prior to the deposition of the metal dots, particular problems were encountered because of chemical contamination of the exposed junction periphery of the mesa. While cleaning of the surface could be performed, the same was costly, time consuming, and did not insure the removal of all contaminants. Using the present technique, the exposed junction periphery of the mesa (the surface 43 in FIG. 6) defining the diode junction, never comes into contact with the photoresist chemicals thereby adverting contamination and destruction of the diode junction.

Figure 6:
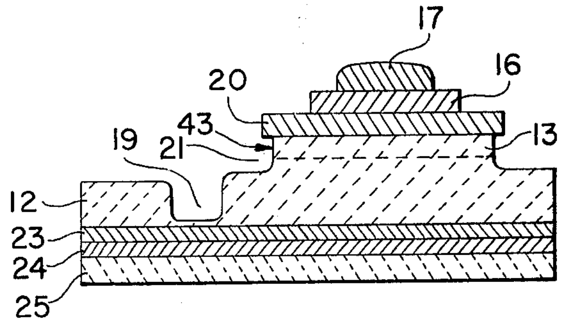

The metallized wafer is next thinned on the reverse side to a total thickness of about 75 microns by a lapping process well known in the art and metallized on the reverse side as shown in FIG. 6 to form layers 23 and 24 of chromium and gold respectively (each about 0.1 micron in thickness) as the second contact area of the diode structure. Since the wafer is extremely thin and fragile at this point, a plate 25 (quartz or sapphire) is waxed (by known techniques) to provide support for further processing. It should be noted that it was necessary to delay application of the support plate prior to this point since the photoresist processing procedures (temperature and solvents) would have otherwise destroyed the waxing bond.

The mesas are now etched as shown in FIG. 6 by etching the silicon to a depth of about 10–20 microns at 21 using the chromium dot as a mask. This etch will continue to reduce wafer thickness along lines 19 as the silicon etch is applied. If the lapping process was properly controlled, this etching step will preferably, although not necessarily, separate the chips along grid lines 19. As can be readily seen such separation has been effected without the introduction of mechanical stresses common in prior art methods. It should be additionally noted that this etching step coupled with subsequent silicon etches, continues to reduce wafer thickness around the mesa. This is particularly important since the amount of parasitic capacitance will be reduced according to the increase in difference between the thickness of the mesa and the rest of the wafer thickness.

Figure 7:
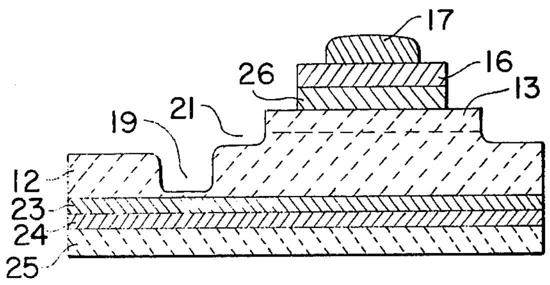
Figure 8:
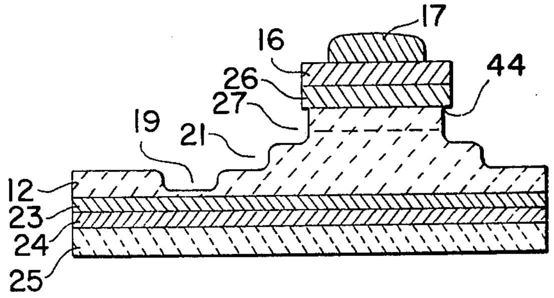

Turning now to FIG. 7, the chrome dot 20 is etched using the gold dot 16 as a mask to produce the chromium layer 26 of approximately the same diameter of the gold dot 16. Again the substrate is etched using the dots as a mask (FIG. 8) to reduce wafer thickness at 27 defining the mesa while further reducing substrate thickness at 19 and 21. As can be seen in FIG. 8, the etching of the silicon to form the mesa causes an undercutting of the chromium dot 26 causing metal overhang at the mesa edge 44. In devices formed by prior known techniques, it was this overhang that caused shorting of the diode junction.

Figure 9:
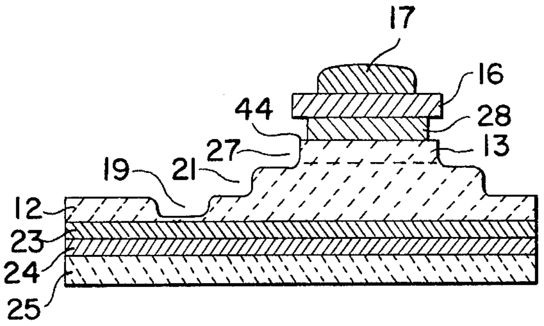

In order to overcome this difficulty, the chrome metallization periphery of dot 26 is etched a small distance (1–2 microns) away from the mesa edge 44 to form dot 28 as shown in FIG. 9 which is uniformly spaced from the mesa edge over the entire mesa. The chrome etch rate is approximately 0.1 micron per minute rendering highly accurate control of the etching distance and precise alignment of the chrome metallization 28 relative to the mesa edge 44. This substantially eliminates any problems previously encountered due to overhang metal induced shorts. It should be particularly noted here that the gold dot 16 facilitates the etching of the chromium to prevent the metal overhang. The gold dot 16 prevents the chromium etch from completely removing the chromium layer by limiting the etch only to the exposed chromium periphery as shown in FIGS. 8 and 9.

Figure 10:
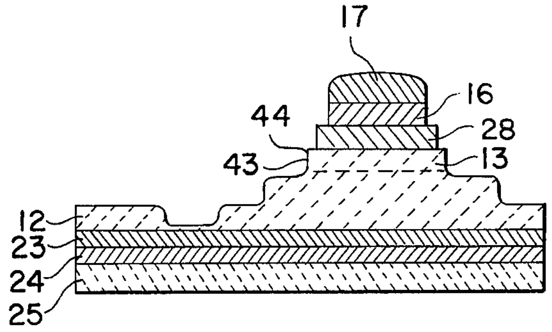

The final step shown in FIG. 10 uses a gold etch to etch layer 16 using the gold button 17 as a mask. Since the button 17 is about 10–100 times as thick as film 16, the etching of the button will be negligible during the time required to etch film 16. By moving the gold layer a substantial distance (e.g., 10 microns) back from the chromium margin, problems with current assisted surface migration of the gold along the chromium surface (which does not migrate) and down the silicon mesa, are substantially eliminated. The wafer can now be removed from the support 25 and broken along grid lines 19 as shown in FIG. 11.

In manufacturing semiconductor devices according to the above technique, it is noted that any combination of semiconductor wafer and metal layers compatible with the wafer, other than those as specified above, can be used provided an etch is available for each component to the exclusion of others. In addition, prior to stripping the photoresist after the formation of chromium dot 20, the silicon could be etched with the resist in place thereby providing additional protection for the silicon mesa junction in the case of pinholes or other irregularities in the chromium layer 14.

From the above description it can be seen that the present invention has indeed resulted in an improved technique for forming mesa semiconductor devices. Contrary to prior known techniques the present invention provides a series of selective etching steps to define the metal dots and prevent mesa surface contamination. The etching steps also provide dicing and substrate thinning that is free of mechanical stress so common in prior techniques. The steps additionally provide for ease and accuracy in dot and button formation forming a highly accurate device configuration. By selective etching of the metal dots, metal overhang at the mesa edge is eliminated to prevent shorting and breaking problems in the finished diode structure.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of producing a diced mesa semiconductor device comprising:

a. forming a semiconductor wafer having an active surface forming one of two opposed wafer surfaces, a first metal layer bonded to the active surface of said wafer and a second metal layer bonded to the surface of said first layer;

b. etching said second layer to form at least one first metal dot on the surface of said first layer;

c. depositing a metal contact button on said at least one metal dot;

d. etching a plurality of grid lines in said first layer and in said wafer to delineate a chip containing said at least one first metal dot;

e. etching said first layer to form a second metal dot concentric with said at least one first metal dot;

f. etching said wafer using said second metal dot as a mask to form a mesa and thin said wafer along said grid lines;

g. etching said second metal dot to a diameter about equal to the diameter of said at least one first dot using said first dot as a mask;

h. again etching the wafer using said dots as a mask whereby undercutting of the dots occurs;

i. etching said second dot so as to prevent metal overhang at the mesa edge;

j. etching said first dot using said button as a mask.

2. The method of claim 1 wherein said metal dot of step (b) is formed of greater diameter than the button of step (c) and wherein the metal dot of step (e) is formed of greater diameter than the metal dot of step (b).

3. The method of claim 1 further including metallizing the other surface of said wafer after step (e) and applying a support thereto, and etching said wafer in step (f) to separate said wafer along said grid lines.

4. The method of claim 3 wherein prior to metallizing the wafer, the other surface is lapped to reduce the thickness of the wafer.

5. The method of claim 1 wherein said wafer is silicon having an active surface region forming a Trapped-Plasma-Avalanche-Transit-Time diode structure, the first metal layer is chromium and the second metal layer is gold, and the layers are formed over the entire surface of the wafer.

6. The method of claim 1 wherein the etching of steps (b), (d) and (e) are performed using a photoresist mask and wherein the depositing of step (c) comprises electroplating a gold button using a photoresist mask.

7. The method of claim 1 wherein said step of forming at least one first metal dot forms a plurality of spaced first metal dots, said step of forming a metal button forms a gold button on each of said plurality of first metal dots, and said step of forming a concentric second metal dot forms a second metal dot concentric with each of said plurality of first metal dots.

8. The method of claim 7 wherein said plurality of grid lines define lines separating said wafer into a plurality of chips with each chip having plural metal dot areas.

* * * * *